United States Patent
Shim et al.

(10) Patent No.: US 10,381,798 B2
(45) Date of Patent: Aug. 13, 2019

(54) HYBRID PHOTON DEVICE HAVING ETCH STOP LAYER AND METHOD OF FABRICATING THE SAME

(71) Applicant: SAMSUNG ELECTRONICS CO., LTD., Suwon-si (KR)

(72) Inventors: Dongsik Shim, Hwaseong-si (KR); Byunggil Jeong, Anyang-si (KR); Byounglyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/805,717

(22) Filed: Nov. 7, 2017

(65) Prior Publication Data
US 2018/0366901 A1    Dec. 20, 2018

(30) Foreign Application Priority Data
Jun. 19, 2017 (KR) .......... 10-2017-0077585

(51) Int. Cl.
| H01S 5/02 | (2006.01) |
| H01S 5/026 | (2006.01) |
| H01S 5/024 | (2006.01) |
| H01S 5/22 | (2006.01) |
| H01S 5/343 | (2006.01) |

(52) U.S. Cl.
CPC .............. *H01S 5/026* (2013.01); *H01S 5/021* (2013.01); *H01S 5/0218* (2013.01); *H01S 5/02453* (2013.01); *H01S 5/22* (2013.01); *H01S 5/343* (2013.01); *H01S 5/34326* (2013.01); *H01S 5/34333* (2013.01)

(58) Field of Classification Search
CPC ........ H01S 5/021; H01S 5/0281; H01S 5/343; H01S 5/34326
See application file for complete search history.

(56) References Cited

U.S. PATENT DOCUMENTS

| | | | |
|---|---|---|---|
| 6,832,013 B1 | 12/2004 | Kuhmann et al. | |
| 7,974,326 B2 | 7/2011 | Leem et al. | |
| 8,787,417 B2 * | 7/2014 | Baets ..................... | B82Y 20/00 372/1 |
| 2009/0116523 A1 | 5/2009 | Leem et al. | |
| 2012/0300796 A1 | 11/2012 | Sysak et al. | |

* cited by examiner

*Primary Examiner* — Michael Carter
(74) *Attorney, Agent, or Firm* — Sughrue Mion, PLLC (57) ABSTRACT

Provided are a hybrid photon device including an etch stop layer and a method of manufacturing the hybrid photon device. The hybrid photon device includes: a silicon substrate including a waveguide on a surface thereof; a front etch stop layer and a rear etch stop layer disposed on a surface of the waveguide, the front and rear etch stop layers formed respectively to either side of the first region in a length direction of the waveguide; and a group III/V light-emitting unit generating light on a region of the silicon substrate between the front and rear etch stop layers.

17 Claims, 8 Drawing Sheets

HYBRID PHOTON DEVICE HAVING ETCH STOP LAYER AND METHOD OF FABRICATING THE SAME

CROSS-REFERENCE TO RELATED APPLICATION

This application claims priority from Korean Patent Application No. 10-2017-0077585, filed on Jun. 19, 2017, in the Korean Intellectual Property Office, the disclosure of which is incorporated herein in its entirety by reference.

BACKGROUND

1. Field

Apparatuses and methods consistent with exemplary embodiments relate to hybrid photon devices having an etch stop layer and methods of fabricating the same.

2. Description of the Related Art

A hybrid photon device includes a photon device in which a group III/V semiconductor is bonded on a silicon substrate. In order to manufacture a hybrid photon device, after bonding a group III/V wafer including a plurality of group III/V material layers onto a silicon wafer, the hybrid photon device may be manufactured by selectively etching the plurality of the III/V group material layers.

When the group III/V material layers are wet-etched to manufacture a hybrid photon device, it is difficult to achieve a precisely shaped hybrid photon device due to an undercut phenomenon occurring in the etching process of the plurality of the group III/V material layers.

When the group III/V material layers are dry-etched to manufacture a hybrid photon device, plasma is generally used. In this case, when the group III/V material layers are sequentially etched to a desired shape, the silicon wafer may also, incidentally, be etched. The surface state of the silicon wafer greatly affects characteristics of the hybrid photon device to be manufactured, and thus, it is difficult to pattern the group III/V material layers by using a dry etching method of the related art.

When the group III/V material layers are dry etched, a part of the lowermost group III/V material layer may remain on the silicon wafer. However, the remaining lowermost group III/V material layer may degrade the performance of the manufactured hybrid photon device.

SUMMARY

One or more exemplary embodiments may provide hybrid photon devices having an etch stop layer on a wave guide and methods of manufacturing the same.

Additional exemplary aspects and advantages will be set forth in part in the description which follows and, in part, will be apparent from the description, or may be learned by practice of the presented embodiments.

According to an aspect of an exemplary embodiment, a hybrid photon device includes: a silicon substrate and a waveguide disposed on a surface thereof; a front etch stop layer and a rear etch stop layer on a surface of the waveguide that are formed respectively to either side of a first region in a length direction of the waveguide; and a group III/V light-emitting unit generating light by being formed on a region of the silicon substrate between the front and rear etch stop layers.

The front and rear etch stop layers may include silicon oxide.

The front and rear etch stop layers may have a thickness in a range from about 5 nm to about 100 nm.

Upper surfaces of the front and rear etch stop layers may be substantially level with or lower than an upper surface of the waveguide.

The group III/V light-emitting unit may include a first type semiconductor layer, a lower separate confinement heterostructure layer, a quantum well layer, an upper separate confinement heterostructure layer, and a second type semiconductor layer which are sequentially stacked on the silicon substrate, and the first type semiconductor layer includes a side region exposed by the lower separate confinement heterostructure layer.

The hybrid photon device may further include a front mirror region and a rear mirror region disposed between the front and rear etch stop layers on the waveguide.

Each of the front mirror region and the rear mirror region may include a grating pattern repeating along a length direction of the waveguide.

The hybrid photon device may further include a first electrode on the second type semiconductor layer and a second electrode on the side region of the first type semiconductor layer.

The waveguide may include a first waveguide and a second waveguide parallel to each other, the group III/V light-emitting unit may be arranged on at least one of the first waveguide and the second waveguide, and may further include a first ring resonator and a second ring resonator disposed between the first waveguide and the second waveguide.

The hybrid photon device may further include etch stop layers disposed on upper surfaces of the first and second ring resonators.

According to an aspect of another exemplary embodiment, a method of manufacturing a hybrid photon device, the method includes: depositing a passivation layer on an upper surface of a silicon substrate; causing the passivation layer to cover a first region of the silicon substrate by patterning the passivation layer; forming an etch stop layer on the silicon substrate exposed by the passivation layer, by oxidizing the silicon substrate; removing the passivation layer; forming a waveguide by patterning the silicon substrate; bonding a group III/V semiconductor substrate comprising a plurality of group III/V material layers onto the silicon substrate; and forming a group III/V light-emitting unit by sequentially patterning the group III/V material layers, wherein the etch stop layer includes a front etch stop layer and a rear etch stop layer formed respectively to either side of the first region on a surface of the waveguide, and the group III/V light-emitting unit is formed between the front and rear etch stop layers.

The forming of the etch stop layer may further include forming the etch stop layer having an upper surface level with or lower than an upper surface of the upper silicon layer by etching a surface of the etch stop layer.

The removing of the passivation layer may further include performing chemical-mechanical polishing (CMP) a surface of the upper silicon layer.

The forming of the waveguide may further include forming a front mirror region and a rear mirror region by forming a grating pattern on the waveguide, repeating along a length direction of the waveguide.

The forming of the waveguide may further include forming a first waveguide and a second waveguide parallel to each other, and a first ring resonator and a second ring resonator between the first and second waveguides, and the forming of the group III/V light-emitting unit may further include forming the group III/V light-emitting unit on at least one of the first waveguide and the second waveguide.

The method may further include forming an etch stop layer on upper surfaces of the first and second ring resonators.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

Reference will now be made in detail to embodiments, examples of which are illustrated in the accompanying drawings. In the drawings, thicknesses of layers and regions may be exaggerated for clarity of the specification. The present exemplary embodiments may have different forms and should not be construed as being limited to the descriptions set forth herein.

It will also be understood that when an element is referred to as being "on" or "above" another element, the element may be in direct contact with the other element or other intervening elements may be present.

Figure 1:
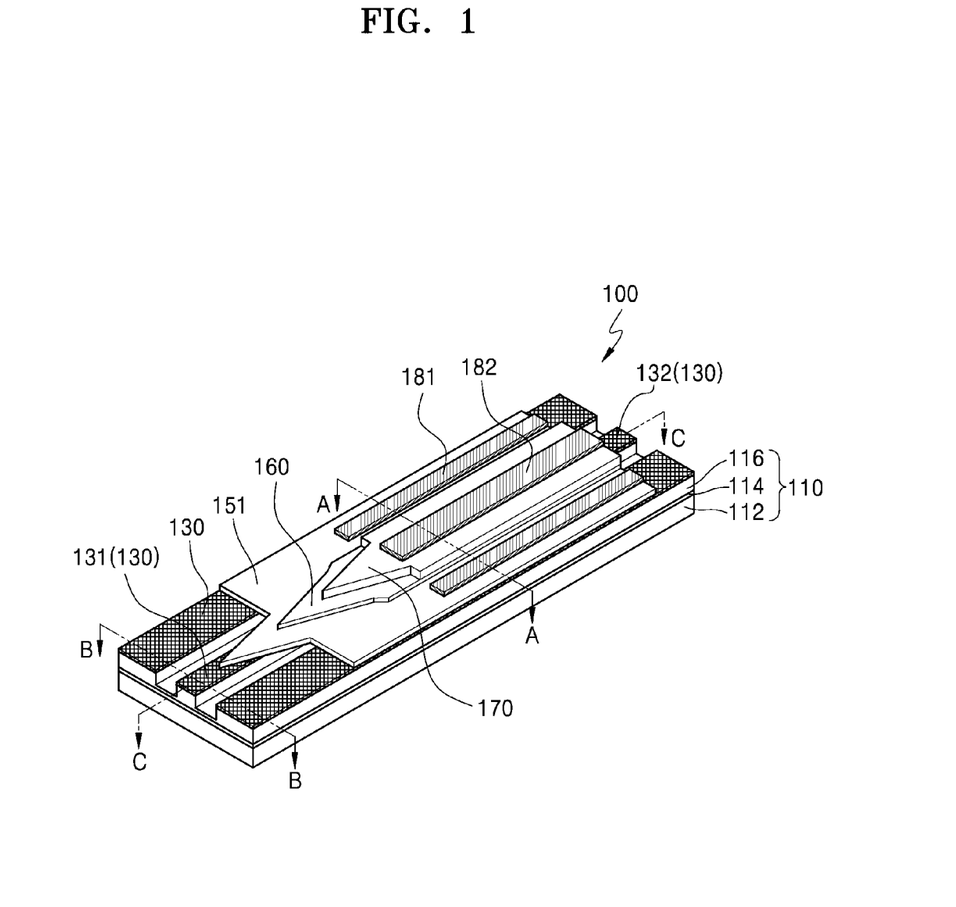
FIG. 1 is a schematic perspective view of a structure of a hybrid photon device according to an exemplary embodiment.
Figure 2:
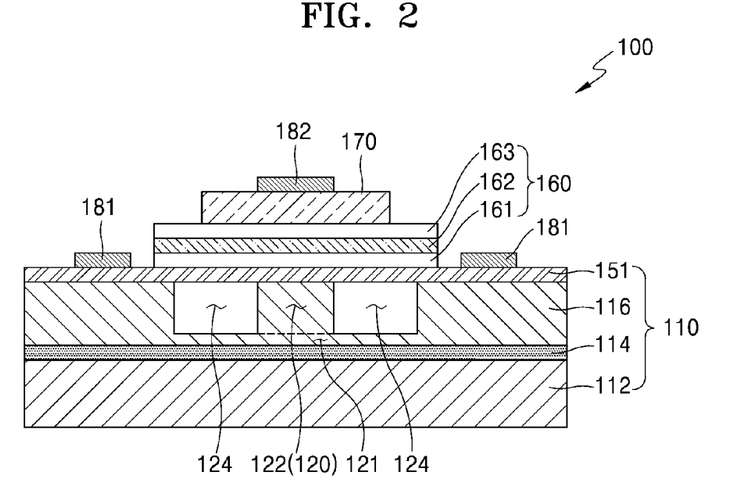
FIG. 2 is a cross-sectional view of taken along a line A-A of FIG. 1.
Figure 3:
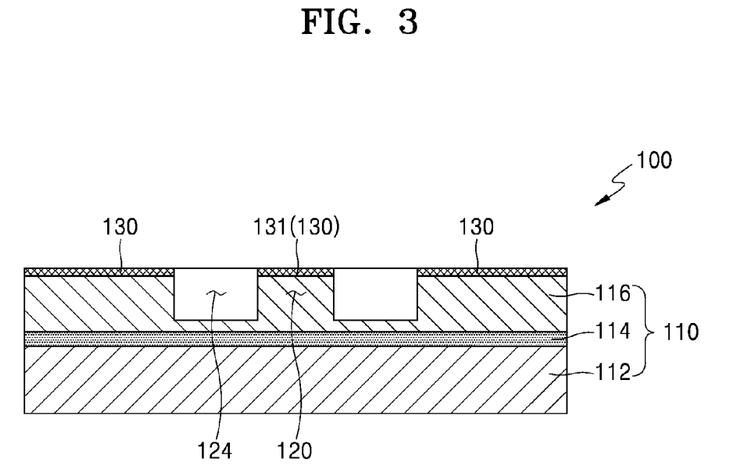
FIG. 3 is a cross-sectional view of taken along a line B-B of FIG. 1.
Figure 4:
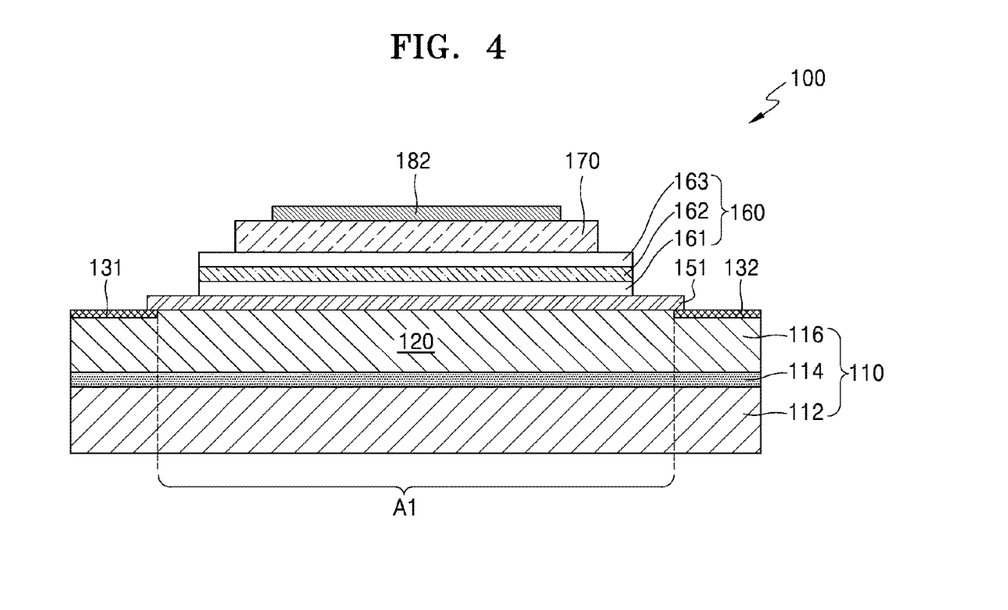
FIG. 4 is a cross-sectional view of taken along a line C-C of FIG. 1.

FIG. 1 is a schematic perspective view of a structure of a hybrid photon device 100 according to an exemplary embodiment. FIG. 2 is a cross-sectional view of taken along a line A-A of FIG. 1. FIG. 3 is a cross-sectional view of taken along a line B-B of FIG. 1. FIG. 4 is a cross-sectional view of taken along a line C-C of FIG. 1.

Referring to FIGS. 1 through 4, the hybrid photon device 100 may be manufactured such that, after bonding a silicon substrate 110 and a group III/V semiconductor substrate including group III/V material layers, the group III/V materials are sequentially etched. The etched group III/V semiconductor substrate may be referred to as a group III/V semiconductor layer.

The silicon substrate 110 may include a lower silicon layer 112, a buried oxide layer 114, and an upper silicon layer 116. The silicon substrate 110 may be a silicon-on-insulator (SOI) substrate. The upper silicon layer 116 may include a waveguide 120 which is substantially straight and extends along a length direction of the hybrid photon device 100. As depicted in FIG. 2, the waveguide 120 may include a rib structure having a bottom part 121 and a protrusion part 122 protruding upward from the bottom part 121. However, the current embodiment is not limited thereto. For example, the waveguide 120 may include only the protrusion part 122, and may have a ridge shape in which the buried oxide layer on both sides of the protrusion part 122 is exposed.

In the upper silicon layer 116, a pair of grooves 124 that expose both sides of the waveguide 120 may be formed along the waveguide 120. The grooves 124 may be filled with air or a material having a low refractive index lower than that of silicon, for example, silicon oxide, silicon nitride, or silicon oxynitride.

An etch stop layer 130 may be formed on a region of the waveguide 120 other than a first region A1 (refer to FIG. 4), in the length direction of the waveguide 120. The etch stop layer 130 may include a front etch stop layer 131 formed on a side of the first region A1 and a rear etch stop layer 132 formed on the other side of the first region A1. As shown in FIG. 1, the etch stop layer 130 may be formed not only on the waveguide 120, but also on regions of the upper silicon region 116 exposed by a light-emitting region.

The etch stop layer 130 may include silicon oxide. The etch stop layer 130 may be formed to have a thickness in a range from about 5 nm to about 100 nm. If the thickness of the etch stop layer 130 is less than 5 nm, the etch stop layer 130 may be etched in a process of forming the etch stop layer 130, and thus, the function of the etch stop layer 130 may be reduced. If the etch stop layer 130 has a thickness greater than 100 nm, a step unit, formed of the etch stop layer 130, having a refractive index different from that of silicon may be formed on the waveguide 120 and the step unit may promote reflection of light, and thus, an optical transmission effect of the waveguide 120 may be reduced.

An upper surface of the etch stop layer 130 may be level with or slightly lower than an upper surface of the waveguide 120, thus a bonding of the upper silicon layer 116 with the group III/V semiconductor substrate becomes easier.

A first type semiconductor layer 151 on the upper silicon layer 116 may be arranged on a region between the front etch stop layer 131 and the rear etch stop layer 132. The first type semiconductor layer 151 may include n-INP. The first type semiconductor layer 151 may be formed to cover the grooves 124. In a plan view, the first type semiconductor layer 151 may be formed to partly overlap the front etch stop layer 131 and the rear etch stop layer 132.

A lower separate confinement heterostructure layer 161, a light-emitting layer 162, an upper separate confinement heterostructure layer 163, and a second type semiconductor layer 170 may be sequentially formed on the first type semiconductor layer 151. The lower separate confinement heterostructure layer 161, the light-emitting layer 162, and the upper separate confinement heterostructure layer 163 may, together, constitute a light-emitting unit 160. The first type semiconductor layer 151, the light emitting unit 160, and the second type semiconductor layer 170 may have a taper shape protruding in a direction in which light is transmitted.

The lower separate confinement heterostructure layer 161 and the upper separate confinement heterostructure layer 163 may include GaAs, GaP, AlGaAs, InGaP, or InGaAlP. The lower separate confinement heterostructure layer 161 may be formed to expose both sides of the first type semiconductor layer 151. The lower separate confinement heterostructure layer 161 and the upper separate confinement heterostructure layer 163 may include different materials from each other.

The light-emitting layer 162 may be a multi-quantum well including a group III/V material, such as AlGaInP. The second type semiconductor layer 170 may include p-INP.

First electrodes 181 may be formed on regions of the first type semiconductor layer 151 exposed by the lower separate confinement heterostructure layer 161. A second electrode 182 may be arranged on the second type semiconductor layer 170. The first electrodes 181 may be n-type electrodes, and the second electrode 182 may be a p-type electrode. The first electrodes 181 and the second electrode 182 may include a metal, for example, Au, Pt, Cu, or Al. When predetermined voltages are applied to the first electrodes 181 and the second electrode 182, light may be generated by the light-emitting layer 162.

The structure of FIGS. 1 through 4 may be a hybrid photon amplifier.

In the hybrid laser diode 100, an upper surface of the waveguide 120 including the etch stop layer 130 at both sides thereof is not damaged when the first type semiconductor layer 151 which is the lowermost layer of the group III/V semiconductor substrate is etched after bonding the silicon substrate 110 to the group III/V semiconductor substrate the etch stop layers 130 formed on both sides of the waveguide 220 with the silicon substrate 110, thus, light loss at the waveguide 120 may be reduced when the light emitted from the hybrid photon device 100 passes the waveguide 120.

Figure 5:
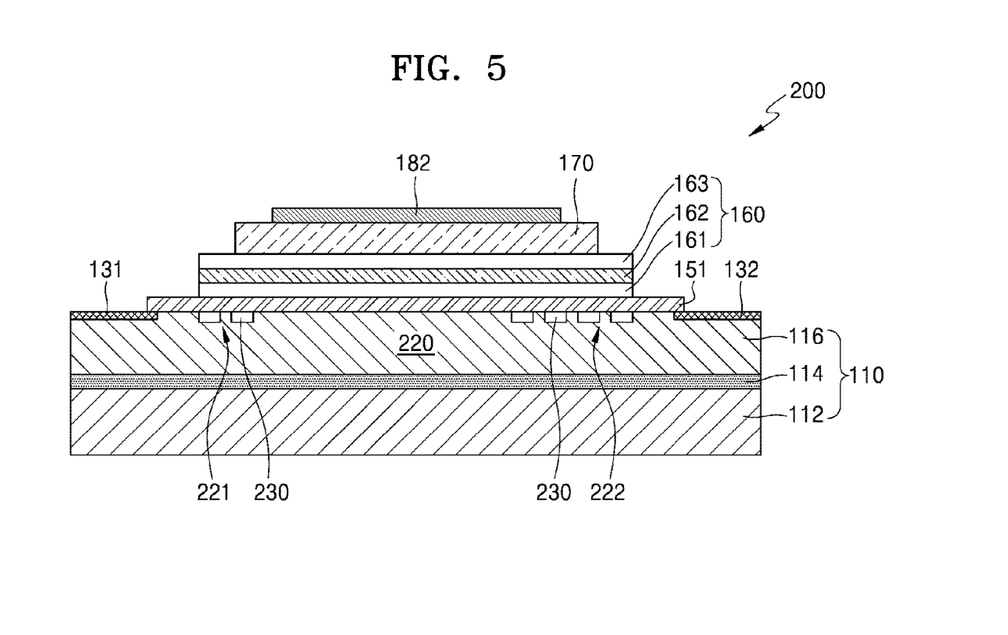
FIG. 5 is a cross-sectional view of a hybrid laser diode according to another exemplary embodiment.

FIG. 5 is a cross-sectional view of a hybrid laser diode 200 according to another exemplary embodiment. FIG. 5 may be a cross-sectional view taken along the line B-B of FIG. 1. Like reference numerals are used to indicate elements that are substantially identical to the elements of FIGS. 1 through 4, and thus, the detailed descriptions thereof will not be repeated.

When the hybrid laser diode 200 is compared with the hybrid photon device 100 described above, the hybrid laser diode 200 of FIG. 5 further includes a front mirror region 221 and a rear mirror region 222 in a waveguide 220 at both sides of a light emitting region when viewed from a plan view. The front mirror region 221 and a rear mirror region 222 on the waveguide 220 may be formed between a front etch stop layer 131 and a second etch stop layer 132.

The front mirror region 221 and the rear mirror region 222 may resonate light generated from the light-emitting layer 162 in the waveguide 220 by reflecting the light, and may emit light that satisfies a predetermined resonant condition. The front mirror region 221 and the rear mirror region 222 may include a grating pattern. The grating pattern may include grooves 230, repeating along a length direction of the waveguide 220. Each groove 230 may extend perpendicular to the length direction of the waveguide 220. A reflectance may be controlled according to a shape of the grating pattern, a repeating period of the grating pattern, and a material filled in the grooves 230.

The rear mirror region 222 is formed to have a higher reflectance than that of the front mirror region 221. For example, the front mirror region 221 may be formed to have a reflectance in a range from about 10% to about 30%, and the rear mirror region 222 may be formed to have a reflectance greater than about 90%, but the current exemplary embodiment is not limited thereto.

Figure 6:
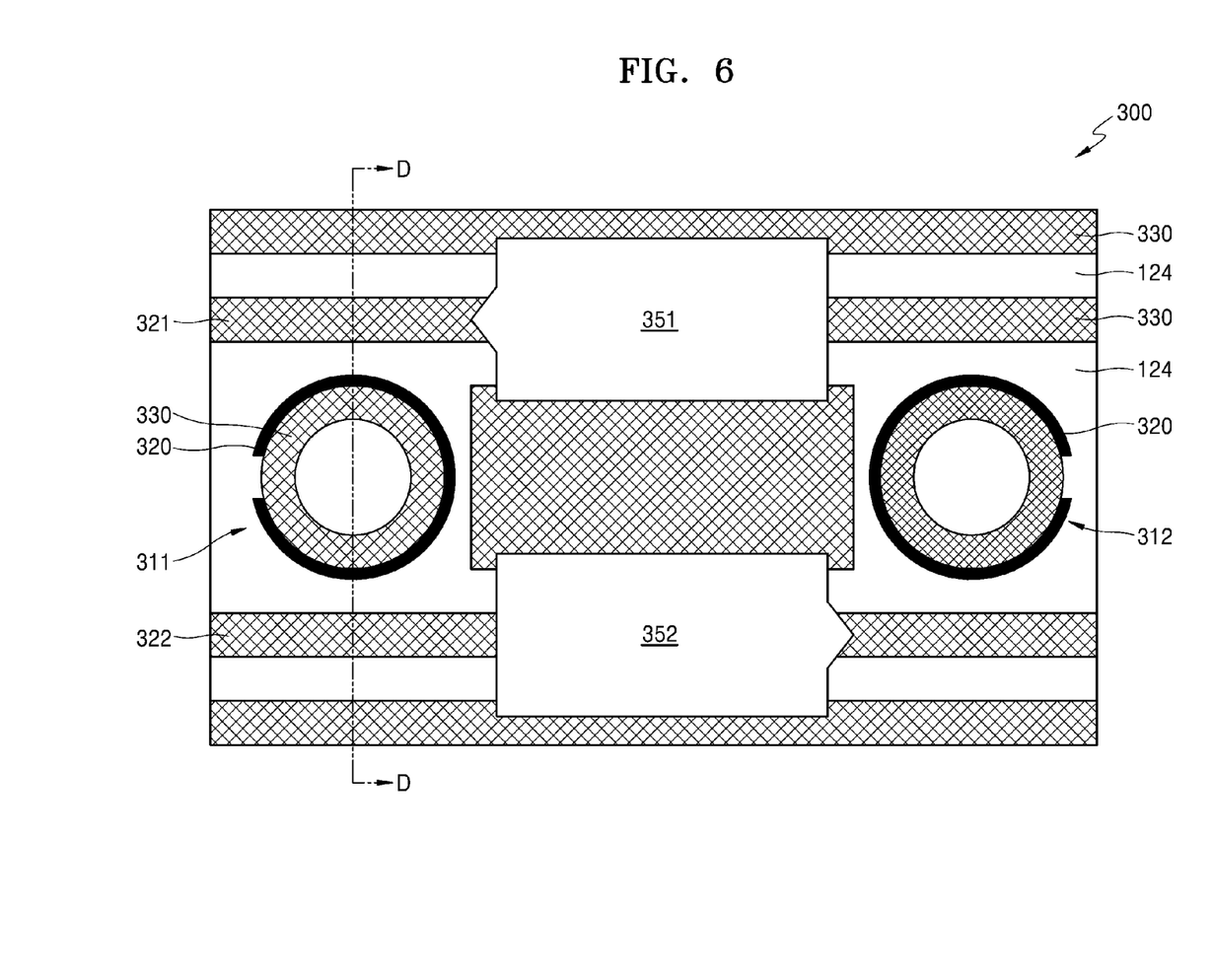
FIG. 6 is a schematic plan view showing a structure of a tunable hybrid laser diode according to another exemplary embodiment.
Figure 7:
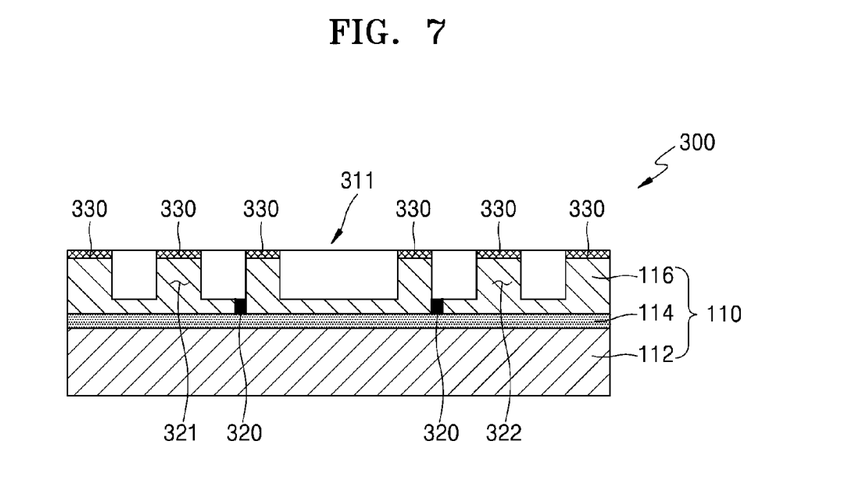
FIG. 7 is a cross-sectional view of taken along a line D-D of FIG. 6.

FIG. 6 is a schematic plan view showing a structure of a tunable hybrid laser diode 300 according to another exemplary embodiment. FIG. 7 is a cross-sectional view of taken along a line D-D of FIG. 6. Like reference numerals are used to indicate elements that are substantially identical to the hybrid photon device 100 described above, and thus, the detailed descriptions thereof will not be repeated.

Referring to FIGS. 6 and 7, a first waveguide 321 and a second waveguide 322 parallel to each other are formed on an upper silicon layer 116 of the silicon substrate 110. A first hybrid photon device 351 may be arranged on the first waveguide 321. A second hybrid photon device 352 may be arranged on the second waveguide 322. The first hybrid photon device 351 and the second hybrid photon device 352 may be substantially identical to the hybrid photon device 100 described above. The tunable hybrid laser diode 300 may include only one of the first hybrid photon device 351 and the second hybrid photon device 352.

A first ring resonator 311 and a second ring resonator 312 may be arranged between the first waveguide 321 and a second waveguide 322. An etch stop layer 330 may be formed on regions of the upper silicon layer 116 exposed by the first hybrid photon device 351 and the second hybrid photon device 352. The etch stop layer 330 may be formed on the first and second ring resonators 311 and 312. The etch stop layer 330 may protect surfaces of the first and second waveguides 321 and 322 and the first and second ring resonators 311 and 312 in a process of etching a group III/V semiconductor substrate that is bonded to the silicon substrate 110.

Each of the first ring resonator 311 and a second ring resonator 312 may include a ring, and a heating element 320 that surrounds the ring. The heating element 320 may be arranged on an outer circumference of the ring. The heating element 320 may be highly doped with a dopant, and may generate heat when a voltage is applied to both ends thereof. Accordingly, a wavelength of light input to the first ring resonator 311 and the second ring resonator 312 may be changed by applying heat. The heating element 320 may be a region doped with a dopant at a concentration in a range from about $10^{18}/cm^3$ to about $10^{19}/cm^3$.

Light input to the first waveguide 321 is amplified in the first hybrid photon device 351 and is outputted from the first hybrid photon device 351, and afterwards, the light is transmitted to the first ring resonator 311. The transmitted light enters the second waveguide 322 after circulating in first ring resonator 311. Next, light inputted to the second waveguide 322 is amplified in the second hybrid photon device 352, and afterwards, the light is outputted to the second waveguide 322. Next, the light is transmitted to the second ring resonator 312 and is re-transmitted to the first waveguide 321. In this process, a wavelength of the light that passes through a corresponding ring resonator may be controlled according to a voltage inputted to the heating element 320. When a desired wavelength of light is generated by repeating the above process, the light is outputted to the outside through the first waveguide 321 or the second waveguide 322.

FIGS. 8A through 8F are cross-sectional views explaining a method of manufacturing a hybrid laser diode according to an exemplary embodiment. FIGS. 8A through 8F are cross-sectional views based on the line C-C of FIG. 1.

Figure 8A:
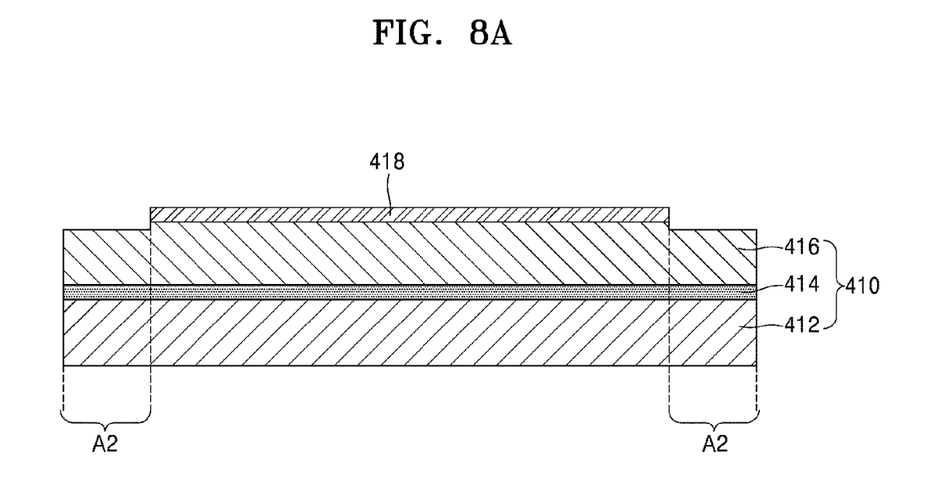
FIGS. 8A through 8F are cross-sectional views for explaining a method of manufacturing a hybrid laser diode according to an exemplary embodiment.

Referring to FIG. 8A, a silicon substrate 410 is prepared. The silicon substrate 410 may be an SOI substrate. The silicon substrate 410 may include a buried oxide layer 414 and an upper silicon layer 416 that are sequentially formed on a lower silicon layer 412.

A passivation layer is deposited on a surface of the upper silicon layer 416. The passivation layer is patterned to form a passivation layer 418. The passivation layer 418 may have a thickness of a few tens of nanometers. The passivation layer 418 may include silicon nitride that may be selectively etched with silicon oxide.

A region A2 where an etch stop layer may be formed is exposed on the upper silicon layer 416 by the passivation layer 418.

Figure 8B:
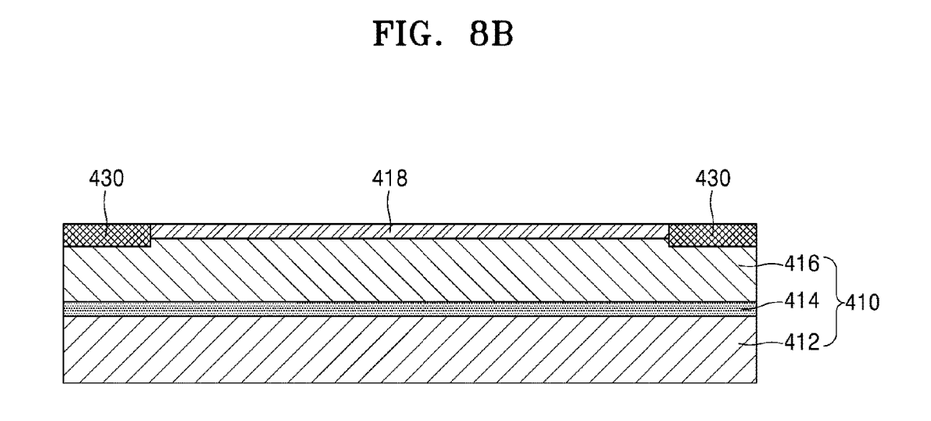

Referring to FIG. 8B, the silicon substrate 410 is thermally oxidized. When the silicon substrate 410 is heated at a temperature approximately 300° C., a silicon oxide layer 430 is formed on the upper silicon layer 416 by oxidizing a surface of the upper silicon layer 416 on the region A2 where the passivation layer 418 is not coated. When the thermal oxidization condition is controlled, the silicon oxide layer 430 having a thickness in a range from about 10 nm to about 200 nm may be formed.

Figure 8C:
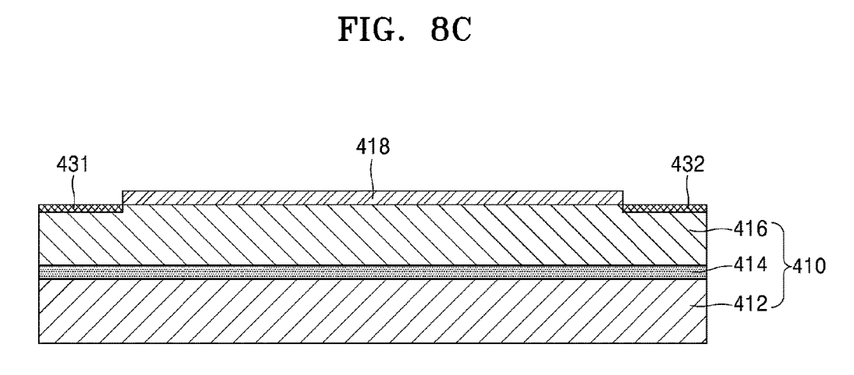

Referring to FIG. 8C, the thickness of the silicon oxide layer 430 is reduced by wet etching the silicon oxide layer 430. For example, the thickness of the silicon oxide layer 430 is reduced so as to make an upper surface of the silicon oxide layer 430 is equal to or lower than an upper surface of the upper silicon layer 416. The etching process is performed to facilitate a bonding of the upper silicon layer 416 with a group III/V semiconductor substrate in a light-emitting region when the group III/V semiconductor substrate and the upper silicon layer 416 are bonded. Resultant products from this etching process are a front etch stop layer 431 and a rear etch stop layer 432. The front and rear etch stop layers 431 and 432 may have a thickness in a range from about 5 nm to about 100 nm.

Figure 8D:
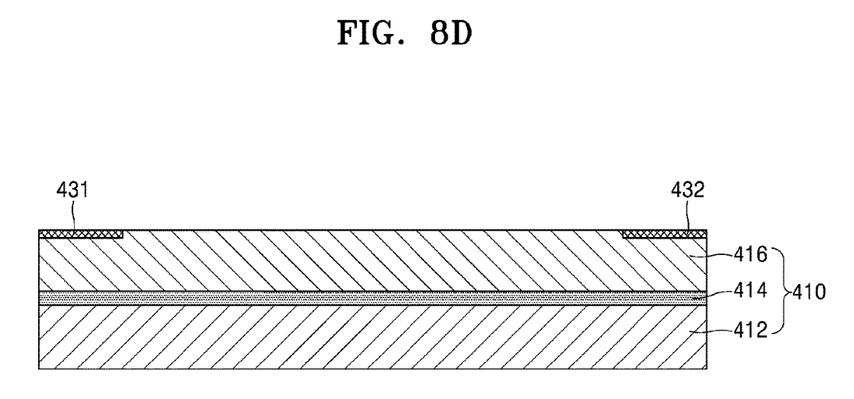

Referring to FIG. 8D, the passivation layer 418 is removed. Next, the thicknesses of the front and rear etch stop layers 431 and 432 may be further controlled by a chemical-mechanical polishing (CMP) process on a surface of the upper silicon layer 416.

Figure 8E:
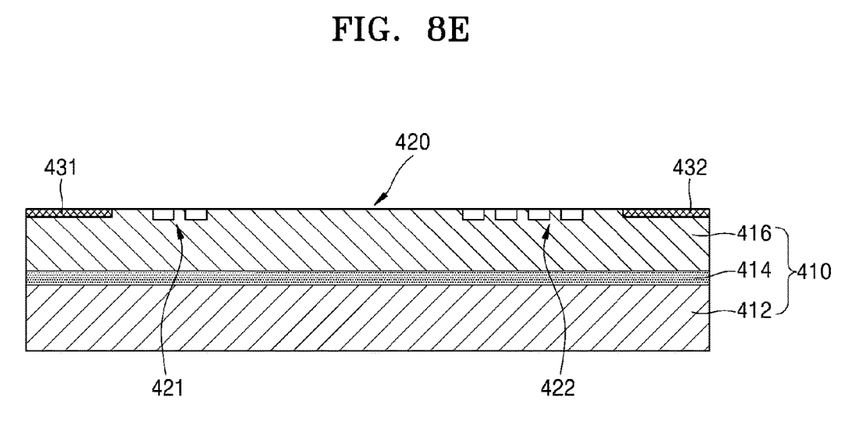

Referring to FIG. 8E, a waveguide 420 is formed by patterning the upper silicon layer 416. The waveguide 420 may have a rib shape or a ridge shape.

A front mirror region 421 and a rear mirror region 422 may be formed by forming a grating pattern along a length direction of the waveguide 420 between the front and rear etch stop layers 431 and 432. The grating pattern may include a plurality of grooves formed on a surface of the waveguide 420. Each groove may extend perpendicular to the length direction of the waveguide 420. In case of manufacturing a hybrid photon amplifier, the process of manufacturing the front mirror region 421 and the rear mirror region 422 may be omitted.

Next, the silicon substrate 410 and the group III/V semiconductor substrate including a double layered group III/V material may be combined by direct bonding. The direct bonding may be performed at a temperature approximately 300° C. by applying pressure.

Figure 8F:
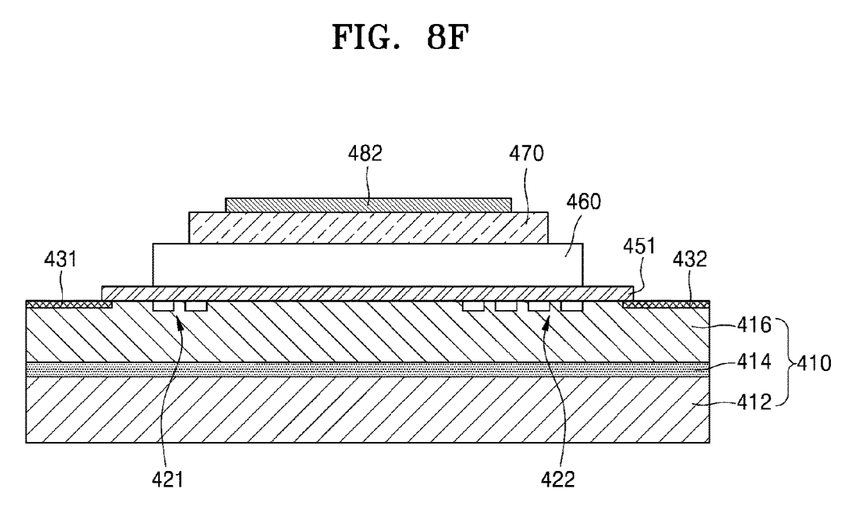

Referring to FIG. 8F, a laser light-emitting unit is formed by sequentially patterning the group III/V semiconductor substrate. The laser light-emitting unit includes a first type semiconductor layer 451, a light-emitting unit 460, and a second type semiconductor layer 470. The laser light-emitting unit may be referred to as a group III/V light-emitting unit.

Next, when a first electrode 181 (refer to FIG. 2) and a second electrode 482 are further formed, the manufacture of a hybrid laser diode may be completed.

The method of manufacturing the tunable hybrid laser diode 300 of FIG. 6 may be known from the method of manufacturing the hybrid laser diode described with reference to FIGS. 8A through 8F, and thus, the detailed description thereof will be omitted.

According to the method of manufacturing a hybrid laser diode according to an exemplary embodiment, a surface of a wave guide may be protected during an etch process by forming an etch stop layer in advance on a silicon substrate, and accordingly, a performance reduction of the manufactured hybrid laser diode may be reduced.

While one or more exemplary embodiments have been described with reference to the figures, it will be understood by those of ordinary skill in the art that various changes in form and details may be made therein without departing from the spirit and scope as defined by the following claims.

What is claimed is:

1. A hybrid photon device comprising:
   a silicon substrate comprising a waveguide on a surface thereof, wherein the waveguide comprises a first region extending in a length direction of the waveguide;
   a front etch stop layer and a rear etch stop layer disposed on a surface of the waveguide, wherein the front etch stop layer is disposed on a first side of the first region and the rear etch stop layer is disposed on a second side of the first region; and
   a group III/V light-emitting unit, configured to generate light, disposed on the first region of the silicon substrate between the front and rear etch stop layers.

2. The hybrid photon device of claim 1, wherein the front etch stop layer and the rear etch stop layer comprise silicon oxide.

3. The hybrid photon device of claim 2, wherein the front etch stop layer and the rear etch stop layer have a thickness in a range from about 5 nm to about 100 nm.

4. The hybrid photon device of claim 3, wherein an upper surface of the front etch stop layer and an upper surface of the rear etch stop layer are substantially level with or are lower than an upper surface of the waveguide.

5. The hybrid photon device of claim 1,
   wherein the group III/V light-emitting unit comprises a first type semiconductor layer, a lower separate confinement heterostructure layer, a quantum well layer, an upper separate confinement heterostructure layer, and a second type semiconductor layer which are sequentially stacked on the silicon substrate, and
   wherein the first type semiconductor layer comprises a side region exposed by the lower separate confinement heterostructure layer.

6. The hybrid photon device of claim 5, further comprising a first electrode disposed on the second type semiconductor layer and a second electrode disposed on the side region of the first type semiconductor layer.

7. The hybrid photon device of claim 1, further comprising a front mirror region disposed on the waveguide, between the front etch stop layer and the rear etch stop layer, and a rear mirror region disposed on the waveguide between the front etch stop layer and the rear etch stop layer.

8. The hybrid photon device of claim 7, wherein each of the front mirror region and the rear mirror region comprises a grating pattern repeating along the length direction of the waveguide.

9. The hybrid photon device of claim 1, wherein the waveguide comprises a first waveguide and a second waveguide arranged parallel to the first waveguide,
   the group III/V light-emitting unit is disposed on at least one of the first waveguide and the second waveguide, and
   the hybrid photon device further comprises a first ring resonator and a second ring resonator disposed between the first waveguide and the second waveguide.

10. The hybrid photon device of claim 9, further comprising an etch stop layer disposed on an upper surface of the first ring resonator and an etch stop layer disposed on an upper surface of the second ring resonators.

11. A method of manufacturing a hybrid photon device, the method comprising:
depositing a passivation layer on an upper surface of a silicon substrate;
causing the passivation layer to cover a first region of the silicon substrate by patterning the passivation layer;
forming an etch stop layer on the silicon substrate exposed by the passivation layer, by oxidizing the silicon substrate;
removing the passivation layer;
forming a waveguide by patterning the silicon substrate;
bonding a group III/V semiconductor substrate, comprising a plurality of group III/V material layers, onto the silicon substrate; and
forming a group III/V light-emitting unit by sequentially patterning the plurality of group III/V material layers,
wherein the etch stop layer comprises a front etch stop layer and a rear etch stop layer disposed on a surface of the waveguide, wherein the front etch stop layer is disposed on a first side of the first region and the rear etch stop layer is disposed on a second side of the first region, and the group III/V light-emitting unit is formed between the front etch stop layer and the rear etch stop layer when viewed from a plan view.

12. The method of claim 11, wherein the etch stop layer has a thickness in a range from about 5 nm to about 100 nm.

13. The method of claim 11, wherein the forming the etch stop layer further comprises forming the etch stop layer to have an upper surface level with or lower than an upper surface of the upper silicon layer by etching a surface of the etch stop layer.

14. The method of claim 13, wherein the removing the passivation layer further comprises performing chemical-mechanical polishing (CMP) the upper surface of the upper silicon layer.

15. The method of claim 11, wherein the forming the waveguide further comprises forming a front mirror region and a rear mirror region by forming a grating pattern on the surface of the waveguide, the grating pattern repeating along a length direction of the waveguide.

16. The method of claim 11, wherein the forming of the waveguide further comprises forming a first waveguide and a second waveguide parallel to the first waveguide, and forming a first ring resonator and a second ring resonator between the first waveguide and the second waveguide, and
the forming the group III/V light-emitting unit further comprises forming the group III/V light-emitting unit on at least one of the first waveguide and the second waveguide.

17. The method of claim 16, further comprising forming an etch stop layer on an upper surface of the first ring resonator and forming an etch stop layer on an upper surface of the second ring resonator.

* * * * *